Figure 1:
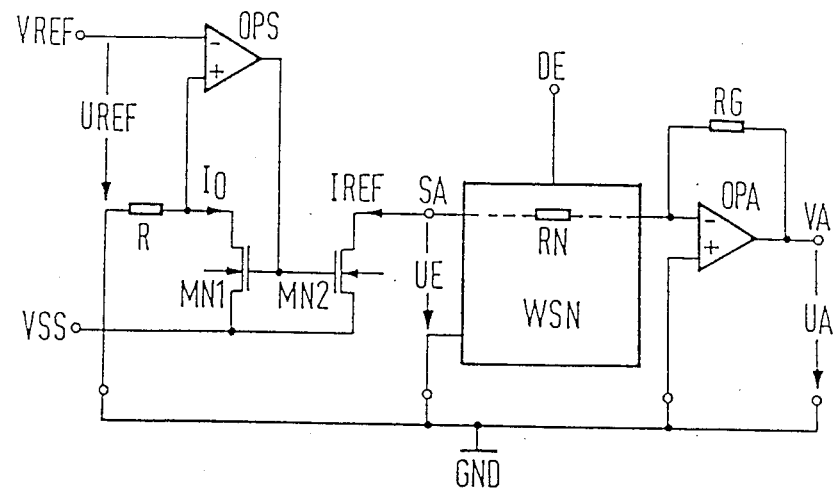

United States Patent [19]
Dielacher

[11] Patent Number: 4,766,415
[45] Date of Patent: Aug. 23, 1988

[54] DIGITAL-TO-ANALOG CONVERTER WITH TEMPERATURE COMPENSATION

[75] Inventor: Franz Dielacher, Villach, Austria

[73] Assignee: Siemens Aktiengesellschaft, Munich, Fed. Rep. of Germany

[21] Appl. No.: 913,390

[22] Filed: Sep. 29, 1986

[30] Foreign Application Priority Data

Sep. 30, 1985 [DE] Fed. Rep. of Germany ....... 3534915

[51] Int. Cl.$^4$ .............................................. H03M 1/06
[52] U.S. Cl. .............................. 340/347 DA; 307/297; 323/312
[58] Field of Search ................... 307/262, 270, 296 R, 307/297; 323/312, 313, 315, 316; 330/264, 288; 340/347 DA

[56] References Cited

U.S. PATENT DOCUMENTS

| | | | |
|---|---|---|---|
| 4,325,017 | 4/1982 | Schade, Jr. .......................... | 323/313 |
| 4,399,374 | 8/1983 | Boeke ................................. | 307/297 |
| 4,539,491 | 9/1985 | Nishioka et al. .................... | 307/270 |
| 4,591,804 | 5/1986 | van Tuijl ............................ | 307/297 |
| 4,647,906 | 3/1987 | Naylor et al. ............... | 340/347 DA |

OTHER PUBLICATIONS

Microelectronic Circuits, Holt, Rinehart, and Winston, 1982, pp. 433–437.

Primary Examiner—William M. Shoop, Jr.
Assistant Examiner—Richard K. Blum
Attorney, Agent, or Firm—Herbert L. Lerner; Laurence A. Greenberg

[57] ABSTRACT

A digital-to-analog converter with a voltage output includes means for applying a reference voltage, a resistance and switch network for converting a digital input code into an analog output current, an inverting operational amplifier connected to the network and negatively fed back by a feedback resistance and a reference current source formed by the reference voltage and a resistance determining the reference current, the reference current source being connected to the resistance and switch network for feeding the network.

13 Claims, 1 Drawing Sheet

DIGITAL-TO-ANALOG CONVERTER WITH TEMPERATURE COMPENSATION

The invention relates to a digital-to-analog converter and, more particularly, to such a converter with a voltage output having a reference voltage, a resistance and switch network for converting a digital input code into an analog output current, and an inverting operational amplifier negatively fed back by a feedback resistance.

Digital-to-analog converters of this general type serve, for example, to convert a binary number into an analog voltage. Various principles of circuitry are described in the book "Halbleiter-Schaltungstechnik" [Semiconductor Circuitry] by U. Tietze and Ch. Schenk, published by the Springer Verlag in Heidelberg, Berlin and New York, 5th revised edition, 1980, pp. 633 ff. In this regard, a reference voltage is used to supply a resistance and switch network which, as a function of the switching status of the switches corresponding to a binary weighting generates weighted currents in the individual branches of the network; with the aid of the post-connected, negatively fed back operational amplifier, these currents are added and converted into a voltage.

The resistors of the resistance and switch network and of the negative feedback resistance of the post-connected operational amplifier must meet stringent requirements for accuracy, depending upon the number of binary digits to be converted. An important parameter for the accuracy of a digital-to-analog converter is its independence of temperature variations.

In German Published Non-Prosecuted Application (DE-OS) No. 31 45 889, there is described a method of compensating for the temperature drift or variation of a generic digital-to-analog converter which takes into account not only the resistors of the resistance and switch network but also the switch resistances, and adapts the measurement of the feedback resistance in the negative feedback branch of the output operational amplifier to these resistances. However, this does not effect an exact temperature compensation.

It is an object of the invention to provide a digital-to-analog converter realized by a resistance and switch network which has an output voltage independent of the temperature.

With the foregoing and other objects in view, there is provided, in accordance with the invention, a digital-to-analog converter with a voltage output including means for applying a reference voltage, a resistance and switch network for converting a digital input code into an analog output current, an inverting operational amplifier connected to the network and negatively fed back by a feedback resistance and a reference current source formed by the reference voltage and a resistance determining the reference current, the reference current source being connected to the resistance and switch network for feeding the network.

In accordance with another feature of the invention, the resistance determining the reference current has a temperature drift which is the same as for the feedback resistance, the feedback resistance being connected in a negative feedback branch of the operational amplifier.

In accordance with a further feature of the invention, the feedback resistance in the negative feedback branch of the operational amplifier has a value which is the same as the value of the resistor determining the reference current.

In accordance with an additional feature of the invention, the reference current source includes a current reflector having an input for receiving a reference input current determined by the reference voltage and the resistance for determining the reference current.

In accordance with an added feature of the invention, the current reflector includes an input transistor having an output circuit connected via the resistance for determining the reference current to a reference potential source, and having a control input connected to an output of another operational amplifier, the other operational amplifier having an inverting input to which the reference potential is applied and a non-inverting input to which the potential of a connecting point of the output circuit of the input transistor and the resistance for determining the reference current is applied.

In accordance with yet another feature of the invention, the reference current source is formed by a bipolar reference current source.

In accordance with yet a further feature of the invention, a bipolar voltage source is applied to the bipolar current source, and the bipolar current source includes a first current reflector having input and output transistors of one conductivity type and a second current reflector having input and output transistors of a conductivity type opposite to the one conductivity type, the current reflectors being serially connected to one another, and the output transistors thereof being switchable off.

In accordance with yet an additional feature of the invention, the first current reflector contains a reflecting transistor having an output circuit serially connected to an output circuit of the input transistor of the second current reflector.

In accordance with yet an added feature of the invention, the input transistor of the first current reflector is connected as a diode.

In accordance with a further feature of the invention, the output circuit of a respective transistor is connected to the input side of control connections of the output transistors, and an output circuit of a respective transistor is connected in parallel to output connections at a supply voltage side of the output transistors.

In accordance with another aspect of the invention, the respective transistor connected to the input side of the control connections and the respective transistor connected in parallel to the output connections are of the same conductivity type as that of the associated output transistors and have control connections connected to a common control terminal.

In accordance with a further aspect of the invention, the transistors of the current reflectors are constructed as cascode transistor stages.

In accordance with an additional aspect of the invention, the transistors of the current reflectors are constructed as a Wilson current source.

In accordance with an added aspect of the invention, the transistors of the current reflectors are constructed as an improved Wilson current source.

In accordance with yet another aspect of the invention, a plurality of the output transistors are connected in parallel.

In accordance with yet a further aspect of the invention, the reflecting transistor of the first current reflector is connected to the input transistor of the second current reflector via at least one resistor.

In accordance with yet an additional aspect of the invention, the reflecting transistor of the first current reflector is connected to the input transistor of the second current reflector via two identical resistors.

In accordance with yet an added aspect of the invention, the transistors of the current reflectors are operated at the same operating point.

In accordance with an another aspect of the invention, the first current reflector includes an input transistor having an output circuit connected via the resistance for determining the reference current to a reference potential source, and having a control input connected to an output of another operational amplifier, the other operational amplifier having an inverting input to which the potential of a connecting point of the output circuit of the input transistor and the resistance for determining the reference current is applied.

In accordance with a concomitant feature of the invention, the converter has a complementary metal oxide semiconductor transistor.

Other features which are considered as characteristic for the invention are set forth in the appended claims.

Although the invention is illustrated and described herein as embodied in digital-to-analog converter with temperature compensation, it is nevertheless not intended to be limited to the details shown, since various modifications and structural changes may be made therein without departing from the spirit of the invention and within the scope and range of equivalents of the claims.

Figure 2:
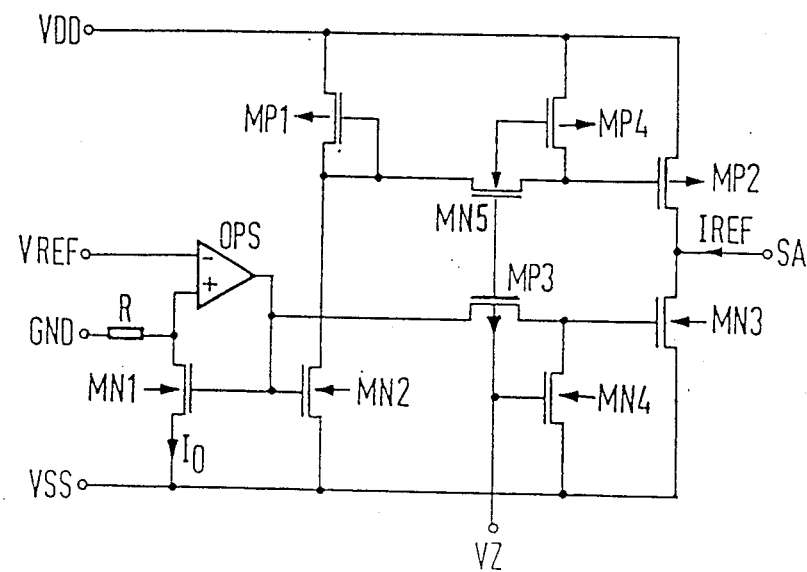

The construction and method of operation of the invention, however, together with additional objects and advantages thereof will be best understood from the following description of specific embodiments when read in connection with the accompanying drawing, in which:

FIG. 1 is a schematic circuit diagram of a first embodiment of a reference current source for a digital-to-analog converter according to the invention having an output voltage that is independent of temperature; and FIG. 2 is a schematic circuit diagram of a second embodiment of the reference current source for the digital-to-analog converter.

Referring now to the drawing and, first, particularly to FIG. 1, there is shown therein a digital-to-analog converter according to the invention which includes a current source, which is formed with the aid of a reference voltage UREF and a resistor R determining the reference current, and supplies a resistance and switch network WSN having an output side to which there is connected an inverting operational amplifier OPA having a negative feedback resistance RG connected, in turn, between its output and its inverting input. The output of the operational amplifier OPA is simultaneously connected to the terminal VA of the digital-to-analog converter which, with respect to the reference potential GND, has an analog output voltage UA corresponding to a converted digital input code.

The resistance and switch network WSN is supplied via a terminal SA to which, according to the invention, a reference current IREF is to be supplied and which has a voltage UE with respect to the reference potential GND. The resistance and switch network WSN is controlled by the digital input code applied to an input terminal DE; an equivalent resistance RN of the network results from, respectively, the digital input code and the switch network controlled by it. Embodiments of a resistance and switch network WSN of this type are disclosed in the herein aforementioned references.

An essential feature of the invention is that the reference voltage at the input of the digital-to-analog converter is converted, with the aid of a resistance R, into a reference current IREF to be supplied to the resistance and switch network WSN, and that the resistance R determining the reference current IREF has the same temperature drift or variation as feedback resistance RG in the negative feedback branch of the output operational amplifier OPA. In the specific exemplary embodiment of FIG. 1, the current source is a current reflector circuit, in which the magnitude of the input current $I_o$ is defined by the resistance R, and the magnitude of the output reference current IREF is defined by the transformation ratio of the current reflector.

An input transistor MN1 of the current reflector has an output circuit connected via the resistance R to the reference potential GND and has a control input connected to the output of a further operational amplifier OPS which has a non-inverting input to which the potential at the connecting point of the resistance R and the output circuit of the input transistor MN1 is applied. The operational amplifier OPS also has an inverting input which is connected to a terminal VREF, to which there is applied a reference potential of UREF volts with respect to the reference potential GND.

A control connection of the input transistor MN1 of the current reflector and an output of the further operational amplifier OPS are connected in common to a control connection of an output transistor MN2 of the current reflector having an output circuit through which a reference current IREF flows. The control connection of the output transistor MN2 of the current reflector, which acts as a collector and drain, respectively, is connected to the supply terminal SA of the resistor and switch network WSN, while the connections of the output circuits of the current reflector formed by the transistors MN1 and MN2, which connections act as emitter and as source, respectively, are connected to a potential-carrying terminal VSS.

In the exemplary embodiment of FIG. 1, the current reflector circuit contains metal oxide transistors of the n-channel type, although the current reflector circuit may also be realized with other field effect transistors or with bipolar transistors.

The reference current IREF flowing into the resistance and switch network WSN is the product of the input current $I_o$ of the current reflector and its transformation ratio, i.e. substantially the ratio of the channel width to the channel length of the transistor MN2 with respect to the associated width-to-length ratio of the transistor MN1. The input current $I_o$ of the current reflector is the quotient of the reference voltage UREF as divided by the resistance R.

The output voltage UA of the digital-to-analog converter is formed by the negative input voltage UE, the existing equivalent resistance RN of the resistance and switch network WSN, and the negative feedback resistance RG of the output operational amplifier OPA. Thus, the output voltage UA is equal to the negative input voltage UE multiplied by the quotient of the negative feedback resistance RG and the existing equivalent resistance RN of the resistance and switch network WSN. On the other hand, the input voltage UE is equal to the product of the existing equivalent resistance RN and the reference current IREF flowing into the network WSN.

If the applicable relationships existing between the currents and voltages for the network according to the invention as shown in FIG. 1 and the output voltage UA are combined as a function of the reference voltage UREF, and if one takes into account that the feedback resistance RG of the negative feedback circuit of the output operational amplifier OPA is equal to, is a multiple of or is a fraction of the resistance R of the current source, then the amount of the output voltage UA is multiplicatively dependent upon the reference voltage UREF, the multiplication factor of the resistance RG with respect to the resistance R, and the transformation ratio of the current reflector formed by the two transistors MN1 and MN2. From this cumulative or sum formula, the resistance values R, RG and RN for the resistance and switch network WSN listed in the above individual relationships have been derived in abbreviated form. This means that the temperature drift or variation of the resistors and of the resistance and switch network is compensated for, whenever the temperature drift or variation of the negative feedback resistance RG and that of the resistance R determining the reference current IREF agree.

It is within the scope of the invention to use, instead of the current source shown in FIG. 1, a cascode or a Wilson and an improved Wilson current source i.e. for providing currents with different polarities or flowing in opposite directions, respectively, so as to increase the internal resistance of the current source even further. Furthermore, in accordance with the invention, switchable bipolar current sources may be used in a cascode, Wilson or improved Wilson embodiment as desired. With bipolar current sources for feeding a bipolar a bipolar differential current IREF into the resistance and switch network WSN, a bipolar output voltage UA is correspondingly obtained.

FIG. 2 presents an exemplary embodiment of a switchable bipolar current source which is the subject of copending patent application Ser. No. [VPA 85 E 5303]. According to FIG. 2, in which identical elements are identified by the same reference numerals, the bipolar current source is supplied by a voltage applied between two terminals VDD and VSS of a bipolar supply voltage source. The circuit includes a first current reflector having metal oxide transistors of the n-channel type and a second current reflector having metal oxide transistors of the p-channel type, which are connected in series, the output transistors of which are triggered alternatingly via transistor switches. The input current $I_o$ which flows in the output circuit of the input transistor MN1 is fed into the first current reflector. The connection of the transistor MN1 acting as a drain is connected via a resistor R to the terminal GND for the reference potential and to the non-inverting input of an operational amplifier OPS. The terminal VREF having the reference voltage UREF with respect to the reference potential is connected to the inverting input of the operational amplifier OPS. The output of the operational amplifier OPS controls the gate of the transistor MN1. The first current reflector also includes the reflector transistor MN2 and the output transistor MN3. While the gates of the transistors MN1 and MN2 are directly connected to one another and to the output of the operational amplifier OPS, the output circuit of a transistor MP3 precedes the gate of the transistor MN3. The connections of the transistors MN1, MN2 and MN3 serving as the source are connected to the terminal VSS of the reflector voltage source. Additionally, the output circuit of a transistor MN4 is located between the gate of the transistor MN3 and the terminal VSS of the supply voltage source.

The output circuits of the transistors MP1 and MP2 of the second current reflector are connected in series with the output circuits of the transistors MN2 and MN3. The gate of the transistor MP1 is connected directly to the connecting point of the output circuits of the transistors MN2 and MP1 and, via the output circuit of a transistor MN5, to the gate of the transistor MP2. The connections of the transistors of the second current reflector are connected to the terminal VDD of the supply voltage source. The gate of the transistor MP2 is also applied to the terminal VDD via the output circuit of a transistor MP4. The terminal SA for the current output of the circuit and for supplying the resistance and switch network WSN, as shown in FIG. 1, is connected to the connecting point of the output circuits of the two output transistors MN3 and MP2. The transistors MN4 and MN5 are of the n-channel type, and the transistors MP3 and MP4 are of the p-channel type. The gates of these last mentioned four transistors are mutually connected to a terminal VZ.

The input current $I_o$ flowing into the circuit is initially reflected into the reflector transistor MN2 and thus also flows through the input transistor MP1 of the second current reflector. Depending upon the algebraic sign (+or −) of a potential applied to the terminal VZ, then either the transistors MN4 and MN5 are blocked and the transistors MP3 and MP4 switched into the conducting state, or the reverse occurs pairwise.

If the potential at the terminal VZ is negative, the transistor MP3 conducts and the transistor MN4 blocks. The input current $I_o$ is then reflected into the transistor MN3, in accordance with the transformation ratio of the first current reflector i.e. substantially in accordance with the ratio of the channel width to the channel length of the transistor MN3 with respect to that of the transistor MN1. The current flowing simultaneously through the transistors MN2 and MP1 has no influence on the output current of the circuit because, with a negative potential at the terminal VZ, the transistor MN5 blocks and the transistor MP4 conducts, so that the output transistor MP2 of the second current reflector is blocked.

If the potential at the terminal VZ is positive, the situations are precisely the reverse i.e. the transistor MP3 blocks and the transistor MN4 conducts, so that the output transistor MN3 reliably blocks. Because, in this case, on the other hand, the transistor MN5 conducts and the transistor MN4 is blocked, the input current $I_o$ is initially reflected into the transistor MN2, in accordance with the transformation ratio of the transistors MN2 to MN1 of the first current reflector. This current, which then flows likewise through the transistor MP1, is reflected into the transistor MP2 in accordance with the transformation ratio of the second current reflector i.e. in accordance with the transformation ratio of the transistors MP2 to MP1. Thus, the reference current IREF flowing into the output terminal SA is either negative or positive, depending upon the potential of the terminal VZ.

Between the output circuits of the transistors MN2 and MP1, there can be one, if not more particularly, two identical resistors, which serve to balance the circuit and to assure identical operating points of the transistors, respectively, if the load is shifted from the terminal SA toward the terminal GND. The bipolar current source can be constructed with different field-effect transistors or bipolar transistors.

The foregoing is a description corresponding, in substance, to German application No. P 35 34 915.8, dated Sept. 30, 1985, the International priority of which is being claimed for the instant application, and which is hereby made part of this application. Any material discrepancies between the foregoing specification and the specification of the aforementioned corresponding German application are to be resolved in favor of the latter.

There is claimed:

1. A digital-to-analog converter with a voltage output comprising means for applying a reference voltage, a resistance and switch network for converting a digital input code into an analog output current, an inverting operational amplifier connected to said network and negatively fed back by a feedback resistance, and a single reference current source formed by a reference voltage and a resistance determining the reference current, said resistance determining the reference current having a temperature drift which is the same as for said feedback resistance, said feedback resistance being connected in a negative feedback branch of said operational amplifier, and said reference current source being connected to said resistance and switch network for feeding the network.

2. Converter according to claim 1, wherein said feedback resistance in said negative feedback branch of said operational amplifier has a value which is the same as the value of said resistor determining the reference current.

3. Converter according to claim 1, wherein said reference current source includes a current reflector having an input for receiving a reference input current determined by the reference voltage and said resistance for determining the reference current, said current reflector including an input transistor having an output circuit connected via said resistance for determining the reference current to a reference potential source, and having a control input connected to an output of another operational amplifier, said other operational amplifier having an inverting input to which the reference potential is applied and a non-inverting input to which the potential of a connecting point of said output circuit of said input transistor and said resistance for determining the reference current is applied.

4. Converter according to claim 1, wherein said reference current source is formed by a bipolar reference current source.

5. A digital-to-analog converter with a voltage output comprising means for applying a reference voltage, a resistance and switch network for converting a digital input code into an analog output current, an inverting operational amplifier connected to said network and negatively fed back by a feedback resistance, and a reference current source formed by a reference voltage and a resistance determining the reference current, said reference current source being connected to said resistance and switch network for feeding the network, said reference current source being formed by a bipolar reference current source, and including a bipolar voltage source applied to said bipolar current source, said bipolar current source including a first current reflector having input and output transistors of one conductivity type and a second current reflector having input and output transistors of a conductivity type opposite to said one conductivity type, said current reflector being serially connected to one another, and said output transistors thereof being switchable off.

6. Converter according to claim 5, wherein said first current reflector contains a reflecting transistor having an output circuit serially connected to an output circuit of said input transistor of said second current reflector, and said input transistor of said second current reflector is connected as a diode.

7. Converter according to claim 5, wherein a respective output circuit of other transistors is connected to the input side of control connections of said output transistors, and a respective output circuit of further transistors is connected in parallel to said control connections and to output connections at a supply voltage side of said output transistors.

8. Converter according to claim 7, wherein said other transistors connected to the input side of said control connections and said further transistors connected in parallel to said control connections and said output connections are of the same conductivity type as that of the associated output transistors and have control connections connected to a common control terminal.

9. Converter according to claim 5, wherein the transistors of said current reflectors are constructed as cascode transistor stages.

10. Converter according to claim 5, wherein a plurality of said output transistors are connected in parallel.

11. Converter according to claim 5, wherein said transistors of said current reflectors have identical operating points.

12. Converter according to claim 5, wherein said first current reflector includes an input transistor having an output circuit connected via said resistance for determining the reference current to a reference potential source, and having a control input connected to an output of another operational amplifier, said other operational amplifier having an inverting input to which the potential of a connecting point of said output circuit of said input transistor and said resistance for determining the reference current is applied.

13. Converter according to claim 5, having a complementary metal oxide semiconductor transistor.

* * * * *